United States Patent
Sugimoto et al.

(10) Patent No.: US 8,310,833 B2
(45) Date of Patent: Nov. 13, 2012

(54) ELECTRONIC CIRCUIT DEVICE AND ELECTRONIC KEY TRANSCEIVER

(75) Inventors: Keiichi Sugimoto, Kariya (JP); Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 885 days.

(21) Appl. No.: 12/243,217

(22) Filed: Oct. 1, 2008

(65) Prior Publication Data
US 2009/0086446 A1    Apr. 2, 2009

(30) Foreign Application Priority Data

Oct. 1, 2007  (JP) ................................ 2007-257836

(51) Int. Cl.
*H05K 1/14* (2006.01)
(52) U.S. Cl. ......... 361/737; 361/736; 361/777; 174/520
(58) Field of Classification Search .......... 361/736–737; 174/520–523
See application file for complete search history.

(56) References Cited

U.S. PATENT DOCUMENTS

| | | | |
|---|---|---|---|
| 5,677,568 A * | 10/1997 | Ochi et al. ..................... | 257/679 |
| 6,282,781 B1 | 9/2001 | Gotoh et al. | |
| 6,285,086 B1 | 9/2001 | Sota et al. | |
| 6,731,010 B2 | 5/2004 | Horiuchi et al. | |
| 6,922,024 B2 * | 7/2005 | Yano et al. ..................... | 315/291 |
| 7,129,110 B1 | 10/2006 | Shibata | |
| 7,458,823 B2 * | 12/2008 | Sugimoto et al. ............ | 439/76.1 |
| 7,604,765 B2 | 10/2009 | Sugimoto et al. | |
| 2006/0252384 A1 | 11/2006 | Sugimoto et al. | |
| 2007/0161269 A1 | 7/2007 | Sugimoto et al. | |

FOREIGN PATENT DOCUMENTS

| | | |
|---|---|---|
| CN | 1462173 | 12/2003 |
| JP | 11-20358 | 1/1999 |
| JP | 2001-257291 | 9/2001 |
| JP | 2004-118511 | 4/2004 |
| JP | 2005-191270 | 7/2005 |

OTHER PUBLICATIONS

Chinese Office Action dated Jun. 4, 2010, issued in corresponding Chinese Application No. 200810167177.5, with English translation.
U.S. Appl. No. 12/243,189 of Sugimoto et al. filed Oct. 1, 2008.
U.S. Appl. No. 12/243,243 of Sugimoto et al. filed Oct. 1, 2008.
Korean Office Action dated May 3, 2010, issued in corresponding Korean Application No. 10-2008-95894, with English translation.
Japanese Office Action dated Jan. 26, 2010, issued in corresponding Japanese Application No. 2007-257836, with English translation.
Office Action (3 pgs.) dated Nov. 17, 2011 issued in corresponding Chinese Application No. 200810167177.5 with an at least partial English-language translation thereof (5 pgs.).

* cited by examiner

*Primary Examiner* — Tuan T Dinh
(74) *Attorney, Agent, or Firm* — Nixon & Vanderhye P.C.

(57) ABSTRACT

A method of making an electronic circuit device includes placing a circuit board in a cavity of a mold such that one side of the circuit board is held in close contact with an inner surface of the cavity, and encapsulating the circuit board in a casing by filling the cavity with a resin material. The one side of the circuit board is exposed to one side of an outer surface of the casing to define part of the one side of the outer surface of the casing. The method further includes thinning the casing by machining the entire one side of the outer surface of the casing.

5 Claims, 4 Drawing Sheets

ELECTRONIC CIRCUIT DEVICE AND ELECTRONIC KEY TRANSCEIVER

CROSS REFERENCE TO RELATED APPLICATION

This application is based on and incorporates herein by reference Japanese Patent Application No. 2007-257836 filed on Oct. 1, 2007.

FIELD OF THE INVENTION

The present invention relates to an electronic circuit device and method of making the electronic circuit device.

BACKGROUND OF THE INVENTION

US 2007/0161269 corresponding to JP-A-2006-303327 discloses an electronic circuit device configured as an electronic key transceiver The electronic circuit device includes a circuit board having first and second sides opposite each other. Electronic elements are mounted on only the first side of the circuit board. The circuit board is encapsulated in a casing in such a manner that the second side of the circuit board is exposed to an outer surface of the casing. Thus, the second side of the circuit board defines part of the outer surface of the casing.

A method of making the electronic circuit device includes a placing process and an encapsulating process subsequent to the placing process. In the placing process, the circuit board is placed in a cavity of a mold (i.e., die) in such a manner that the second side of the circuit board can be held in close contact with an inner surface of the cavity. In the encapsulating process, a liquid resin material is injected under pressure into the cavity of the mold and then cured (i.e., solidified).

Since the circuit board is held in close contact with the inner surface of the cavity, the circuit board can be prevented from being greatly deformed by pressure and heat, which are applied to the circuit board in the encapsulating process.

In the method described above, after the resin material is injected to the cavity, air may be trapped in a gap between the electronic element and the circuit board. The air trapped in the gap may expand due to the pressure and heat and cause a bulge (bump or the like) on the second side of the circuit board. Further, the second side of the circuit board may jut out due to a difference in coefficients of linear (thermal) expansion between the circuit board and the casing. Since the second side of the circuit board is exposed to the outer surface of the casing, the bulge and the jut mar the appearance of the electronic key transceiver.

Such a deformation on an exposed side of the circuit board can be eliminated by a sanding technique or the like. However, generally, the deformation on the exposed side of the circuit board is very small, has a complex shape, and differs from product to product. Therefore, it is difficult to automate an eliminating process to eliminate the deformation, and the eliminating process may be performed manually. As a result, it takes a lot of man hours to eliminate the deformation. Further, the manual eliminating process may result in a decrease in accuracy (i.e., flatness) of the second side of the circuit board.

SUMMARY OF THE INVENTION

In view of the above-described problem, it is an object of the present invention to provide an electronic circuit device and a method of making the electronic circuit device to allow automation of an eliminating process to eliminate a deformation on an exposed surface of a circuit board.

According to an aspect of the present invention, a method of making an electronic circuit device includes preparing a circuit board and an electronic element mounted on only a first side of the circuit board, placing the circuit board in a cavity of a mold such that a second side of the circuit board is held in close contact with an inner surface of the cavity. The first and second sides of the circuit board are opposite each other. The method further includes encapsulating the circuit board and the electronic element in a casing by filling the cavity with a resin material. The casing has a first thickness in a direction from the first side to the second side of the circuit board. The method further includes removing the casing from the mold. The second side of the circuit board is exposed to one side of an outer surface of the casing to define part of the one side of the outer surface of the casing. The method further includes thinning the casing from the first thickness to a second thickness by machining the entire one side of the outer surface of the casing.

According to another aspect of the present invention, an electronic circuit device includes a circuit board having first and second sides opposite each other, an electronic element mounted on only the first side of the circuit board, and a resin casing configured to encapsulate the circuit board and the electronic element. The second side of the circuit board is exposed to one side of an outer surface of the casing to define part of the one side of the outer surface of the casing. The entire one side of the outer surface of the casing is machined.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Figure 3:
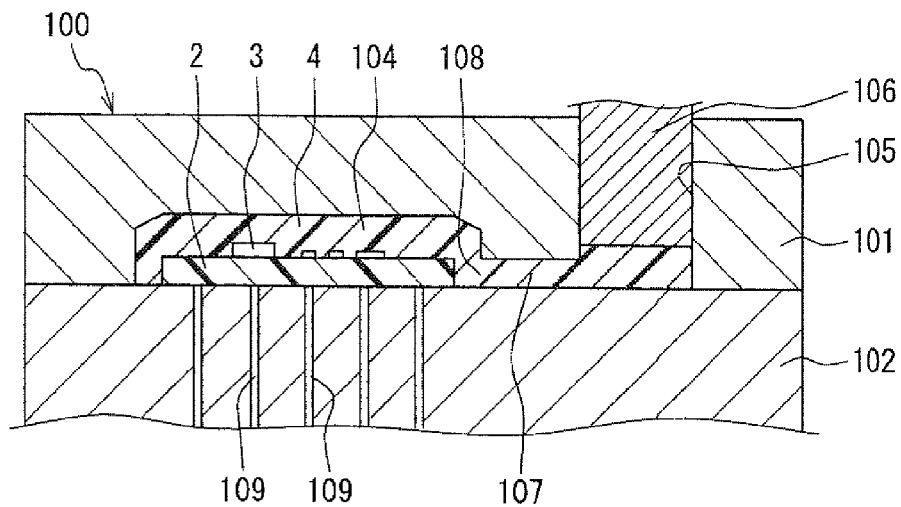
FIG. 3 is a diagram illustrating a cross-sectional view of an encapsulating process of the method of making the electronic key transceiver.
Figure 4:
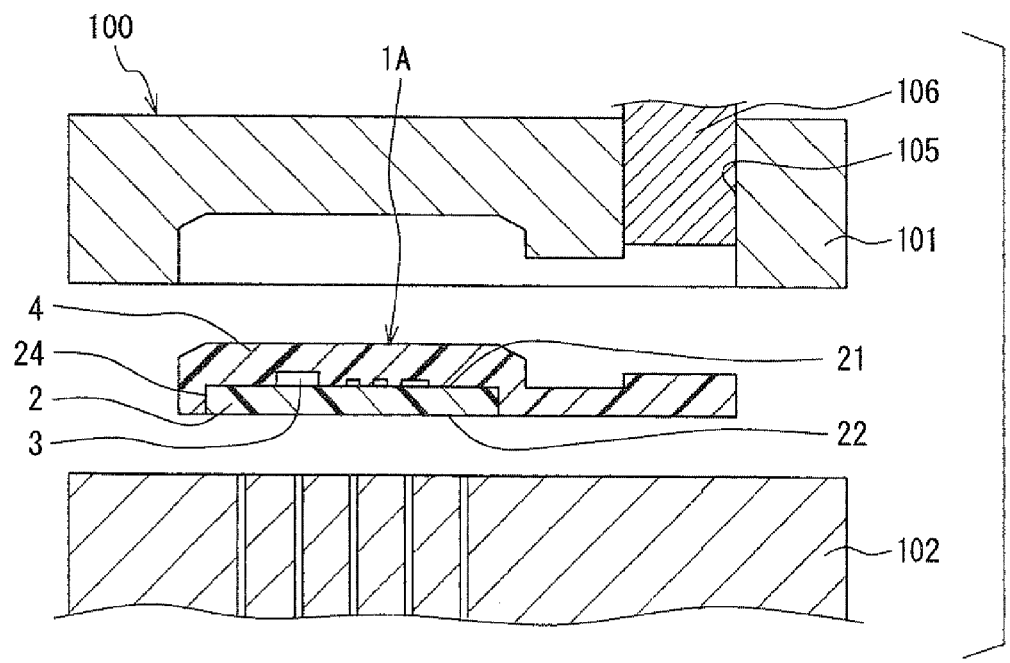
FIG. 4 is a diagram illustrating a cross-sectional view of a removing process of the method of making the electronic key transceiver.
Figure 5A:
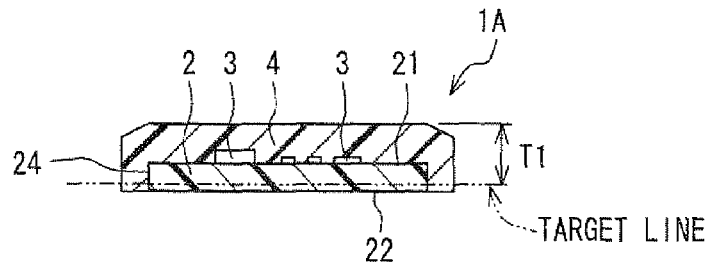
FIG. 5A is a diagram illustrating a cross-sectional view of a semi-finished electronic key transceiver.
Figure 5B:
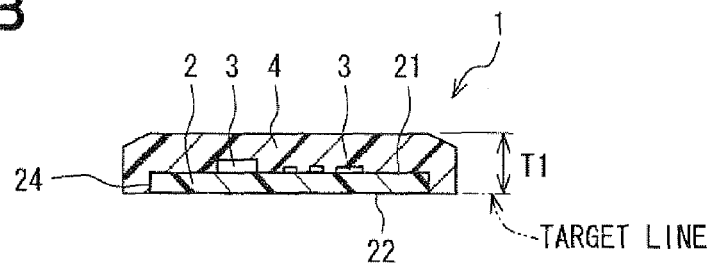
FIG. 5B is a diagram illustrating a cross-sectional view of the electronic key transceiver as a finished product.

An electronic key transceiver 1 according to an embodiment of the present invention is described below with reference to FIGS. 1-5B. FIG. 5B illustrates the electronic key transceiver 1 as a finished product. The electronic key transceiver 1 includes a circuit board 2, an electronic element 3 mounted on the circuit board 2, and a casing 4 made of a resin material. For example, the electronic key transceiver 1 can be used in a vehicle electronic key system and carried by a vehicle's driver.

Figure 1:
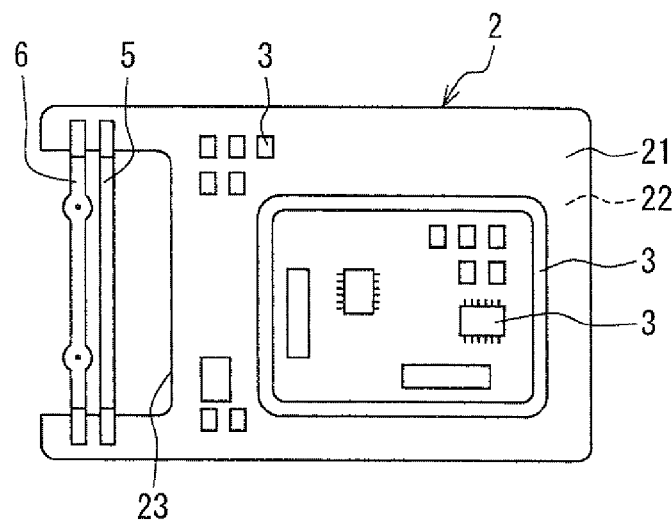
FIG. 1 is a diagram illustrating a top view of a circuit board of an electronic key transceiver according to an embodiment of the present invention.

As illustrated in detail in FIG. 1, positive and negative terminals 5, 6 are soldered to the circuit board 2. The circuit board 2, the electronic element 3, and solder joints between each of the positive and negative terminals 5, 6 and the circuit board 2 are encapsulated in the casing 4.

The circuit board 2 can be made, for example, by forming an electrical conductor trace pattern (e.g., copper foil) to an electrical insulator base such as a glass epoxy board. In the embodiment, the circuit board 2 employs a glass-reinforced epoxy board as the electrical insulator base. Alternatively, the electrical insulator base can be a board other than a glass-reinforced epoxy board.

The circuit board 2 has first and second sides 21, 22 opposite each other. The electronic element 3 is mounted on only the first side 21 of the circuit board 2 so that the second side 22 of the circuit board 2 can be flat. An example of the electronic element 3 can be a resistor, a capacitor, a diode, a transistor, an integrated circuit (IC) module, an antenna, or the like.

The circuit board 2 has a cutout 23 that defines a battery space where a battery (not shown) is accommodated. For example, the battery can be a button-type battery. The positive terminal 5 spans the cutout 23 and is soldered to the trace pattern of the circuit board 2 at each end. Likewise, the negative terminal 6 spans the cutout 23 and is soldered to the trace pattern of the circuit board 2 at each end. When the battery is accommodated in the battery space, positive and negative poles of the battery are in contact with the positive and negative terminals 5, 6, respectively. Thus, the electronic key transceiver 1 can be powered by the battery accommodated in the battery space.

Figure 2:
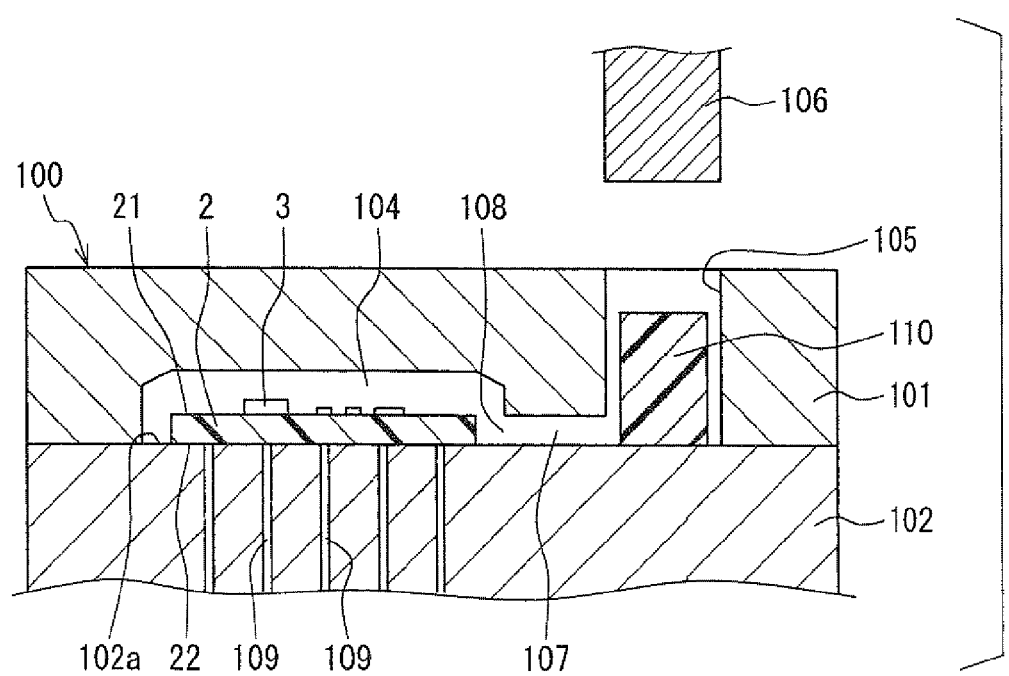
FIG. 2 is a diagram illustrating a cross-sectional view of a placing process of a method of making the electronic key transceiver.

The casing 4 of the electronic key transceiver 1 is made by using a mold 100 (i.e., a die) illustrated in FIG. 2. The circuit board 2, to which the electronic element 3 and the positive and negative terminals 5, 6 are mounded, is placed in a cavity 104 of the mold 100 in such a manner that the second side 22 of the circuit board 2 can be held in close contact with an inner surface of the cavity 104.

The mold 100 includes an upper mold 101, a lower mold 102, and a slide core (not shown). The slide core is sometimes also referred as a "side core". The slide core covers middle portions of the positive and negative terminals 5, 6 to form the battery space. The upper and lower molds 101, 102 are fixed to movable or fixed platens of a molding machine (not shown).

The upper mold 101 of the mold 100 has a sprue (i.e., runner) 107. A pot 105 is formed on an upstream side of the sprue 107, and a gate 108 is formed on a downstream side of the sprue 107. A plunger 106 (i.e., piston) of the molding machine is located above the pot 105 so that the plunger 106 can enter and exit the pot 105. A tablet 110 as a solid resin material is charged into the pot 105, and then the plunger 106 enters the pot 105. As a result, the tablet 110 can change to a liquid resin material. The liquid resin material flows from the pot 105 to the cavity 104 by passing through the sprue 107 and the gate 108.

The lower mold 102 of the mold 100 has a suction hole 109 exposed to a surface 102a. The suction hole 109 is coupled through a pipe (not shown) to an external suction source (not shown) such as a vacuum pump.

A method of making the electronic key transceiver 1 is described below with reference to FIGS. 2-5A. The method includes a placing process illustrated in FIG. 2, an encapsulating process subsequent to the placing process and illustrated in FIG. 3, a removing process subsequent to the encapsulating process and illustrated in FIG. 4, and a thinning process subsequent to the removing process and illustrated in FIG. 5A.

Firstly, the placing process is described below with reference to FIG. 2. In the placing process, the second side 22 of the circuit board 2 is placed on the surface 102a of the lower mold 102 so that the circuit board 2 can be located on the suction hole 109. Then, the upper mold 101 and the lower mold 102 are assembled and clamped together to form the cavity 104. As a result, the circuit board 2 is located in the cavity 104 of the mold 100. At this time, the suction hole 109 is maintained at negative pressure by the suction source with respect to the cavity 104 so that the circuit board 2 can be held in close contact with the inner surface of the cavity 104.

Then, the tablet 110 as the resin material for the casing 4 is charged into the pot 105 of the mold 100. The tablet 110 can be made of thermoset resin. In the embodiment, the tablet 110 is made of epoxy resin. For example, B-stage (i.e., semi-cured) epoxy resin powder is compressed into the tablet 110. The use of the tablet 110 (i.e., the use of solid material instead of liquid material) can improve manufacturability of the electronic key transceiver 1 and also help prevent air bubble from being trapped in the casing 4 of the electronic key transceiver 1. If necessary, the tablet 110 can be preheated before being charged into the pot 105.

A temperature of the mold 100 needs to be adjusted to cause a curing reaction of the epoxy resin. Further, since the electronic element 3 and the positive and negative terminals 5, 6 are joined to the circuit board 2 by solder, the temperature of the mold 100 needs to be less than a melting temperature of the solder. In the embodiment, the solder has a melting temperature of about 240° C., and the epoxy resin has a curing reaction temperature of about 170° C. Therefore, for example, the temperature of the mold 100 can be adjusted to about 200° C.

As describe above, the casing 4 of the electronic key transceiver 1 is made of the epoxy resin. Since the epoxy resin has high heat resistance and high mechanical resistance, the electronic key transceiver 1 can be suitably protected against damage. Therefore, although the electronic key transceiver 1 is carried by the driver at all times, a reliability of the electronic key transceiver 1 can be ensured.

The resin material for the casing 4 of the electronic key transceiver 1 can be thermoset resin other than epoxy resin, as long as a curing reaction temperature of the resin material is less than a melting temperature of the solder. For example, the resin material can be phenolic resin, unsaturated polyester resin, or the like.

Next, the encapsulating process performed subsequent to the placing process is described below with reference to FIG. 3. In the encapsulating process, the plunger 106 moves down and enters the pot 105 so that the tablet 110 located in the pot 105 can change to the liquid epoxy resin. The liquid epoxy resin is injected into the cavity 104 through the sprue 107 and the gate 108 so that the cavity 104 can be filled with the liquid epoxy resin. The liquid epoxy resin in the cavity 104 receives heat from the mold 100. The heat causes a curing reaction of the liquid epoxy resin. As a result, the liquid epoxy resin is cured and molded into the casing 4. In this way, the circuit board 2 is encapsulated in the casing 4 made of the resin material.

Next, the removing process performed subsequent to the encapsulating process is described below with reference to FIG. 4. In the removing process, the mold 100 is opened, and the circuit board 2 encapsulated in the casing 4 is removed from the mold 100 by using an eject mechanism (not shown) of the molding machine. Then, as shown in FIG. 5A, the casing 4 is cut along the gate 108 to eliminate an unnecessary portion corresponding to the pot 105 and the sprue 107. In this way, a semi-finished electronic key transceiver 1A as a semi-finished product can be made.

The casing 4 encapsulates the electronic element 3 mounted on the circuit board 2, the first side 21 and a side surface 24 of the circuit board 2, and the solder joints between each of the positive and negative terminals 5, 6 and the circuit board 2. Therefore, circuitry of the electronic key transceiver 1 can be sealed in the casing 4 so that the electronic key transceiver 1 can be made waterproof.

The second side 22 of the circuit board 2 is exposed to one side of an outer surface of the casing 4 and forms a flat continuous surface in conjunction with the one side of the outer surface of the casing 4. Thus, the second side 22 of the circuit board 2 defines part of the one side of the outer surface of the casing 4.

The electronic key transceiver 1 has a rectangular shape like a card. For example, the electronic key transceiver 1 can be sized to substantially meet an ID-1 format (85.60×53.98 mm) specified by ISO 7810, except for the thickness.

As can be seen by comparing FIGS. 5A and 5B, a thickness of the semi-finished electronic key transceiver 1A is slightly greater than a thickness T1 of the electronic key transceiver 1.

Specifically, the one side of the outer surface of the casing 4 of the semi-finished electronic key transceiver 1A extends beyond a target line corresponding to the thickness T1 by a predetermined distance. The target line is represented by a two-dot chain line in FIGS. 5A, 5B.

In the embodiment, the distance is set to about 0.3 millimeters. That is, the thickness of the semi-finished electronic key transceiver 1A is about 0.3 millimeters greater than the thickness T1 of the electronic key transceiver 1.

When the distance is equal to or greater than about 0.2 millimeters, the thinning process described later can be accurately performed. Specifically, the entire one side of the outer surface of the casing 4 of the semi-finished electronic key transceiver 1A can be uniformly machined. However when the distance exceeds 0.4 millimeters, the amount of wasted material increases. Therefore, it is preferable that the distance be from 0.2 millimeters to 0.4 millimeters.

Finally, the thinning process performed subsequent to the removing process is described below with reference to FIGS. 5A, 5B. In thinning process, the semi-finished electronic key transceiver 1A shown in FIG. 5A is thinned down to the thickness T1. Specifically, the one side of the outer surface of the casing 4 of the semi-finished electronic key transceiver 1A is machined (i.e., grinded, polished, or the like) for example, using a sanding machine, until the target line is exposed. In this way, the electronic key transceiver 1 shown in FIG. 5B is made. If necessary, a surface treatment such as coating (painting) is applied to an outer surface of the electronic key transceiver 1 so that the machined side of the electronic key transceiver 1 can have a good appearance.

Figure 6:
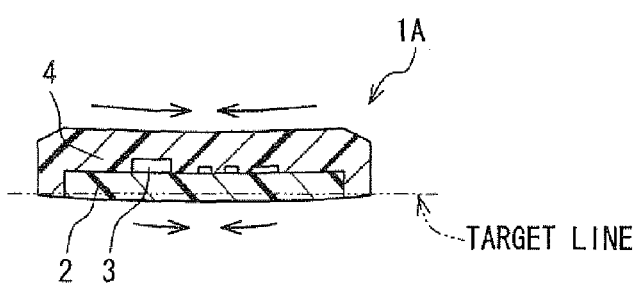
FIG. 6 is a diagram illustrating a cross-sectional view of the semi-finished electronic key transceiver having a warpage.

After the encapsulating process is finished, the casing 4 of the semi-finished electronic key transceiver 1A may contract (i.e., shrink) with a decrease in temperature. As a result, as shown in FIG. 6, the semi-finished electronic key transceiver 1A may warp such that the second side 22 of the circuit board 2 juts out.

Figure 7:
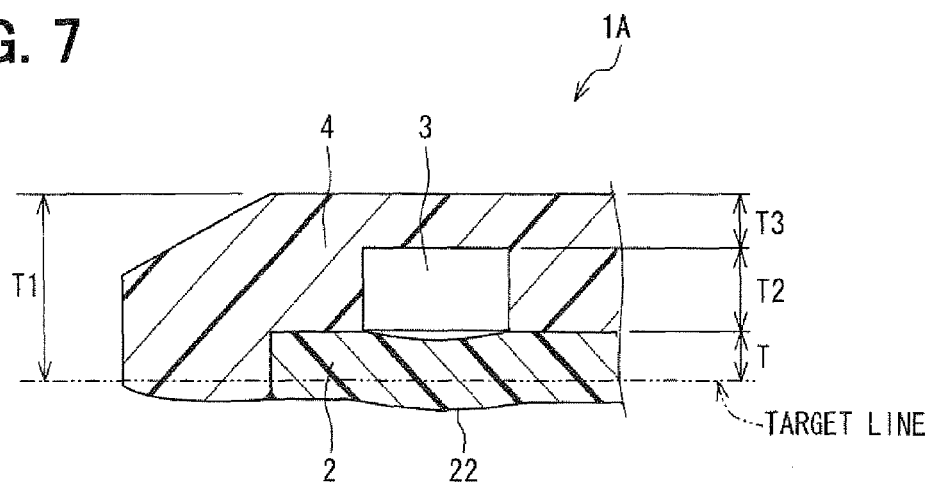
FIG. 7 is a diagram illustrating a cross-sectional view of the semi-finished electronic key transceiver having a bulge.

As shown in FIG. 7, after the encapsulating process is finished, air may be trapped in a gap between the circuit board 2 and the electronic element 3. The air trapped in the gap may cause a bulge (bump or the like) on the second side 22 of the circuit board 2 of the semi-finished electronic key transceiver 1A.

As mentioned previously, the second side 22 of the circuit board 2 is exposed to the one side of the outer surface of the casing 4 to define part of the one side of the outer surface of the casing 4. In the thinning process, the entire one side of the outer surface of the casing 4 of the semi-finished electronic key transceiver 1A is uniformly machined so that the warpage and bulge on the second side 22 of the circuit board 2 can be surely eliminated. Therefore, the electronic key transceiver 1 as a final product can have no warpage and no bulge.

For example, the electronic key transceiver 1 is kept in a wallet, when the driver carries the electronic key transceiver 1. Therefore, it is preferable that the thickness T1 of the electronic key transceiver 1 be less than or equal to about 3 millimeters so that the electronic key transceiver 1 can be put in the wallet.

In some applications, a thickness T2 of the electronic element 3 mounted on the circuit board 2 can reach up to about 1.5 millimeters. It is preferable that a thickness T3 of the casing 4 located on the electronic element 3 be greater than or equal to about 0.5 millimeters so that the electronic element 3 can be surely protected by the casing 4. Therefore, a thickness T of the base of the circuit board 2 of the electronic key transceiver 1 needs to be less than 1 millimeter (i.e., T=T1−T2−T3).

Figure 8A:
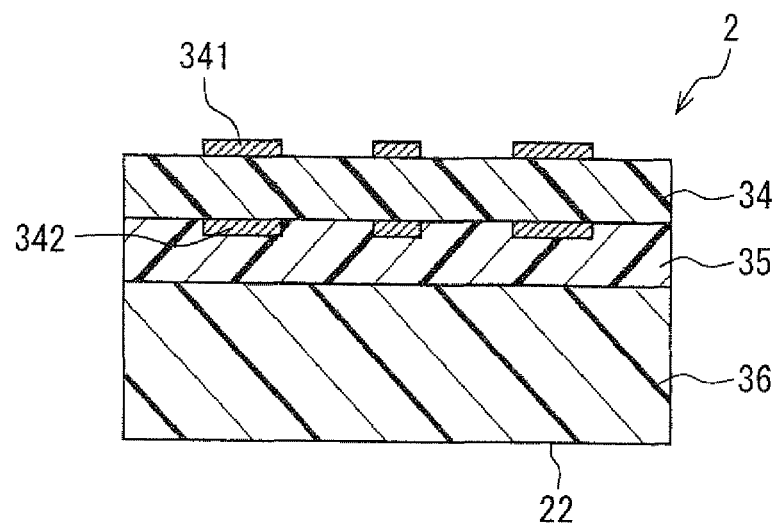
FIG. 8A is a diagram illustrating a cross-sectional view of a circuit board of the semi-finished electronic key transceiver.
Figure 8B:
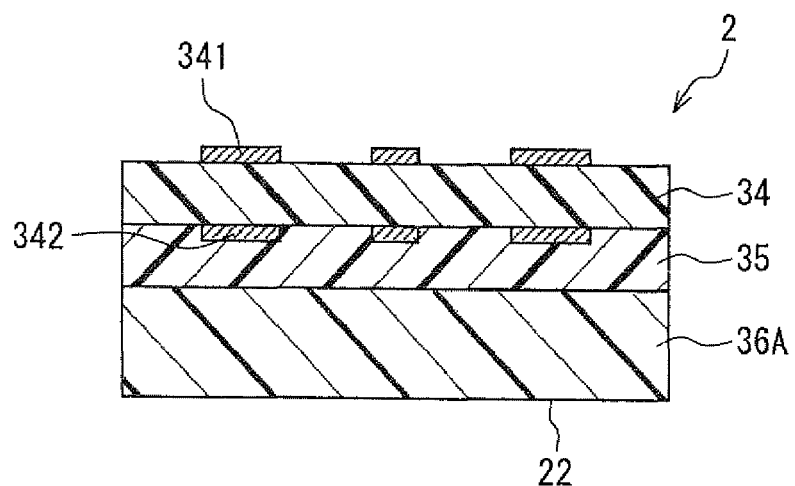
FIG. 8B is a diagram illustrating a cross-sectional view of the circuit board of the electronic key transceiver.

FIG. 8A illustrates the circuit board 2 of the semi-finished electronic key transceiver 1A. FIG. 8B illustrates the circuit board 2 of the electronic key transceiver 1. That is, FIG. 8A illustrates the circuit board 2 before the thinning process is finished, and FIG. 8B illustrates the circuit board 2 after the thinning process is finished.

As shown in detail in FIG. 8A, the circuit board 2 includes a first base 34, a prepreg layer 35, and a second base 36. Trace patterns 341, 342 are formed on both sides of the first base 34, respectively. The trace patterns 341, 342 are electrically connected together via a through hole (not shown) in the first base 34. The second base 36 has no trace pattern. The prepreg layer 35 is sandwiched between the first and second bases 34, 36 and serves as a adhesive layer. The first base 34, the prepreg layer 35, and the second base 36 are joined together by hot pressing.

In FIG. 8B, a distance from the second side 22 of the trace pattern 342 needs to be greater than about 0.4 millimeters in order to ensure a resistance to static electricity. Further, a glass epoxy board, which is used for the first base 34, having a thickness of less than about 0.2 millimeters is less commonly available in a market. Therefore, it is preferable that the thickness T of the base of the circuit board 2 of the electronic key transceiver 1 be greater than or equal to about 0.6 millimeters. That, it is preferable that the thickness T of the base of the circuit board 2 of the electronic key transceiver 1 be from about 0.6 millimeters to about 1 millimeter.

In the embodiment, the first base 34 has a thickness of about 0.2 millimeters, the second base 36 has a thickness of about 0.7 millimeters, and the prepreg layer 35 has a thickness of about 0.2 millimeters. Therefore, the thickness of the base of the circuit board 2 of the semi-finished electronic key transceiver 1A is about 1.1 millimeters. In the thinning process, the second base 36 of the semi-finished electronic key transceiver 1A is thinned by about 0.3 millimeters so that a second base 36A of the electronic key transceiver 1 can have a thickness of about 0.4 milimeters. Therefore, the thickness T of the base of the circuit board 2 of the electronic key transceiver 1 is about 0.8 millimeters.

As described above, according to the embodiment, the semi-finished electronic key transceiver 1A is thicker than the electronic key transceiver 1 as a finished product. The semi-finished electronic key transceiver 1A is thinned by uniformly machining the entire one side of the outer surface of the casing 4 in the thinning process. Accordingly the second side 22 of the circuit board 2 is uniformly machined so that a deformation (i.e., bulge, warpage, or the like) on the second side 22 of the circuit board 2 can be surely eliminated.

In the thinning process, the one side of the outer surface of the casing 4 is entirely machined, regardless of size or shape of the deformation on the second side 22 of the circuit board 2. Therefore, the thinning process can be automated.

The second side 22 of the circuit board 2 is exposed to the one side of the outer surface the casing to define part of the one side of the outer surface of the casing 4. In such an approach, the thickness T1 of the electronic key transceiver 1 can be reduced.

The circuit board 2 employs the glass-reinforced epoxy board as the base. In such an approach, the electronic key transceiver 1 can have both stiffness and toughness.

In the thinning process, the one side of the outer surface of the casing 4 is machined. Therefore, although the base of the circuit board 2 is a glass-reinforced board, the deformation on the second side 22 of the circuit board 2 can be accurately, easily removed.

The embodiment described above can be modified in various ways. For example, the thinning process can include grinding, polishing, or cutting the one side of the outer surface of the casing 4. For example, the one side of the outer surface of the casing 4 can be gradually polished using a polishing compound, until the target line is exposed. Alternatively, the one side of the outer surface of the casing 4 can be cut along the target line.

The casing 4 can be made by using a molding technique other than a transfer molding technique. For example, the casing 4 can be made by using an injection molding technique, a compression molding technique, or the like.

The electronic key transceiver 1 (i.e., the casing 4) can have a shape other than a card. The present invention can be applied to an electronic circuit device other than an electronic key transceiver.

Such changes and modifications are to be understood as being within the scope of the present invention as defined by the appended claims.

What is claimed is:

1. An electronic circuit device comprising:
a circuit board having first and second sides opposite each other;
an electronic element mounted on only the first side of the circuit board; and
a resin casing configured to encapsulate the circuit board and the electronic element, wherein:
the second side of the circuit board is exposed to one side of an outer surface of the casing to define part of the one side of the outer surface of the casing,
the entire one side of the outer surface of the casing including the exposed second side of the circuit board is a machined flat surface,
the circuit board includes a first base and a second base joined to the first base, the first base and the second base being joined together through a prepreg layer,
the first base has trace patterns on both sides and defines the first side of the circuit board, and
the second base has no trace pattern and defines the second side of the circuit board.

2. The electronic circuit device according to claim 1, wherein the casing has a substantially card shape.

3. The electronic circuit device according to claim 2, wherein the circuit board includes a base made of glass-reinforced epoxy resin.

4. The electronic circuit device according to claim 3, wherein the entire one side of the outer surface of the casing is polished.

5. An electronic key transceiver comprising:
a circuit board having first and second sides opposite each other;
an electronic element mounted on only the first side of the circuit board; and
a resin casing configured to encapsulate the circuit board and the electronic element, wherein:
the second side of the circuit board is exposed to one side of an outer surface of the casing to define part of the one side of the outer surface of the casing,
the entire one side of the outer surface of the casing including the exposed second side of the circuit board is a machined flat surface,
the circuit board includes a first base, a second base and an adhesive layer sandwiched between the first base and the second base,
the first base has trace patterns on both sides and defines the first side of the circuit board, and
the second base has no trace pattern and defines the second side of the circuit board.

* * * * *